United States Patent
Racz et al.

(10) Patent No.: US 12,508,625 B2
(45) Date of Patent: Dec. 30, 2025

(54) METHOD OF MANUFACTURING PROCESSED BODY PROVIDED WITH WATER-REPELLENT SURFACE, AND PROCESSED BODY PROVIDED WITH WATER-REPELLENT SURFACE

(71) Applicant: FURUKAWA ELECTRIC CO., LTD., Tokyo (JP)

(72) Inventors: Ilona Racz, Budapest (HU); Botond Marosfoi, Budapest (HU); Csenge Vamos, Budapest (HU); Yukako Nakai, Tokyo (JP); Yu Mimura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 166 days.

(21) Appl. No.: 17/936,520

(22) Filed: Sep. 29, 2022

(65) Prior Publication Data
US 2023/0037550 A1   Feb. 9, 2023

Related U.S. Application Data

(63) Continuation of application No. PCT/JP2021/013990, filed on Mar. 31, 2021.

(30) Foreign Application Priority Data

Mar. 31, 2020   (JP) .................. 2020-065081

(51) Int. Cl.
*B05D 5/00* (2006.01)
*B05D 3/00* (2006.01)
(Continued)

(52) U.S. Cl.
CPC ............... *B05D 5/00* (2013.01); *B05D 3/002* (2013.01); *B05D 3/007* (2013.01); *C08J 7/02* (2013.01);
(Continued)

(58) Field of Classification Search
CPC .......... B05D 5/00; B05D 3/002; B05D 3/007; B05D 2201/00; B05D 2401/20;
(Continued)

(56) References Cited

U.S. PATENT DOCUMENTS

| 4,465,715 A | 8/1984 | Manabe et al. |
| 2002/0150723 A1 | 10/2002 | Oles et al. |

(Continued)

FOREIGN PATENT DOCUMENTS

| CN | 103755996 A | 4/2014 |
| JP | S5715870 A | 1/1982 |
| JP | 2012062379 A | 3/2012 |

OTHER PUBLICATIONS

First Notice of Examination Opinion for Chinese Patent Application No. 202180024279.5 dated Apr. 27, 2023, pp. all.
(Continued)

*Primary Examiner* — Brian Handville
(74) *Attorney, Agent, or Firm* — Dorsey & Whitney LLP

(57) ABSTRACT

A method of manufacturing a processed body having a hydrophobic and water-repellent surface, and a processed body having a hydrophobic and water-repellent surface. The method includes: a step of contacting a member made of a crystalline or semicrystalline polymer with a solvent in a solvent-contacting region; and a step of taking the member contacted with the solvent out of the solvent-contacting region and drying the member.

7 Claims, 2 Drawing Sheets

(51) Int. Cl.
  *C08J 7/02*   (2006.01)
  *C08J 7/05*   (2020.01)
(52) U.S. Cl.
  CPC ............. *C08J 7/05* (2020.01); *B05D 2201/00* (2013.01); *B05D 2401/20* (2013.01)
(58) Field of Classification Search
  CPC . C08J 7/02; C08J 7/05; C08J 2323/12; B82Y 40/00; B08B 17/065
  See application file for complete search history.

(56) References Cited

U.S. PATENT DOCUMENTS

| | | |
|---|---|---|
| 2007/0009709 A1 | 1/2007 | Krishnan et al. |
| 2012/0142795 A1 | 6/2012 | Varanasi et al. |
| 2017/0141244 A1* | 5/2017 | Khaled ..................... C08J 7/02 |

OTHER PUBLICATIONS

EESR dated Mar. 21, 2024 in EP application No. 21780250.3; pp. all.

Zhu Tang et al: "Supporting Information : Robust Polypropylene Fabrics Super-Rapelling Various Liquids : A Simple, Rapid and Scalable Fabrication Method by Solvent Swelling", Applied Materials & Interfaces, vol. 7 , No. 25 , Jul. 1, 2015(Jul. 1, 2015), pp. 13996-14003, XP093139192, US ISSN; 1944-8244, DOI: 10.1021/acsami.5b03056; * captions of figure S8; figure S8 *.

Zhu Tang et al: "Robust Polypropylene Fabrics Super-Rapelling Various Liquids : A Simple, Rapid and Scalable Fabrication Method by Solvent Swelling", Applied Materials & Interfaces, vol. 7, No. 25, Jun. 22, 2015 (Jun. 22, 2015), pp. 13996-14003, XP093138632, US ISSN: 1944-8244, DOI : 10.1021/acsami. 5b03056 *sections 2.2, 3.1, 3.2, 3.4 ; figures 1-3, 6, 7 ; table 1*.

"Solubility Parameter (Averagehildebrand Solubility Parameter)", Polymer Properties Database < Retrieved from:http://polymerdatabase.com/polymer%20physics/delta%20Table.html > Retrieved Date: Jul. 6, 2022; pp. all.

Gabriela Chagas al: "Preparation of Superhydrophobic and Superoleophobicsurfaces and the Effect of Chemical Heterogeneity on Hysteresis", The Eights International Conference on Material Technologies and Modeling, Oct. 2012; pp. all.

International Search Report and Written Opinion for International Application No. PCT/JP2021/013990 (English translation of Search Report only); dated Jun. 22, 2021; pp. all.

* cited by examiner

METHOD OF MANUFACTURING PROCESSED BODY PROVIDED WITH WATER-REPELLENT SURFACE, AND PROCESSED BODY PROVIDED WITH WATER-REPELLENT SURFACE

CROSS REFERENCE TO RELATED APPLICATIONS

The present application is a continuation application of international Patent Application No. PCT/JP2021/013990 filed on Mar. 31, 2021, which claims the benefit of Japanese Patent Application No, 2020-065081, flied on Mar. 31, 2020. The contents of these applications are incorporated herein by reference in their entirety.

BACKGROUND

The present disclosure relates to a method of manufacturing a processed body provided with a water-repellent and very low water wettable surface, and a processed body provided with a water-repellent and very low water wettable surface.

A degree of wetting with water on an object surface is expressed as water wettability (hydrophilicity, good wetting or hydrophobicity, poor wetting). For example, the low wettability may be obtained by having a hydrophobic coating with a fluorine-based compound or having micro-scaled or nano-scaled fine projections on a surface. Water repellency is a special manifestation of water wetting performance of the surface, where the spherical shaped water droplet is rolling-off the surface.

A lotus leaf has fine papillae on its surface and based on such a fine structure exhibits low water wettability with a waterdrop forming a spherical shape on the surface (so-called "lotus effect").

Additionally, the so called hierarchical structure (micro- and nanoscale roughness at the same time) a lotus leaf possesses allows an object surface to repel water, and in addition, dirt is less likely to adhere to the object surface.

The wettability of a surface of an object can be expressed by static wettability and dynamic wettability. The static wettability can be specified with a contact angle between a droplet being in a static state on the surface of the object and the surface. A larger contact angle means that an object is less likely to be wet, that is lower wettability or higher hydrophobicity. In general, those having a contact angle of 90° or larger are referred to as "hydrophobic", and those having a contact angle of larger than 140° are referred to as "superhydrophobic".

The dynamic wettability is defined by: "sliding angle" represented by an angle of an inclination at which a droplet left to stand on a surface of an object slides down on the inclined surface; contact angle hysteresis (CAH) represented by a difference between an advancing contact angle and a receding contact angle when a droplet slides down on an inclination; and the like.

The contact angle hysteresis is considered to be generated by the presence of a fine structure on a surface of an object that causes uneven energy required for moving a droplet on the surface to generate a plurality of metastable states. Thus, it is considered that the contact angle hysteresis depends on a shape, size, and the like of the fine structure, and has a close relationship with behavior in which liquid spreads on the surface of an object while wetting the surface. A smaller contact angle hysteresis tends to indicate a higher water repellency.

A substrate itself may have hydrophobic surface, but there are also techniques for further reducing wettability and/or improving the water repellency that the substrate and the like originally have. For example, there is a method for producing a water-repellent surface based on a fine structure, and more specifically, known techniques include etching using laser or plasma, etching treatment such as chemical etching using a treatment liquid surface structuring using a template, and the like. Such treatments can further reduce wettability and/or improve the water repellency of the substrate and the like.

For example, a method of producing a superhydrophobic surface on a surface of polypropylene is disclosed in Gabriela Chagas, Thomaz C. Rangel, Marco A. Justino, Daniel E. Weibel, PREPARATION OF SUPERHYDROPHOBIC AND SUPEROLEOPHOBIC SURFACES AND THE EFFECT OF CHEMICAL HETEROGENEITY ON HYSTERESIS, The Eights International Conference on Material Technologies and Modeling, MMT-2014 (ISBN: 978-965-91944-2-1), (Jul. 28 to Aug. 1, 2014, Ariel City, Israel). According to this method, a polypropylene specimen having a contact angle of 110° or smaller is firstly immersed in xylene at 135° C. for several seconds to form a microstructure with crystals on the specimen surface. It is also disclosed that the contact angle hysteresis, CAH, on the specimen surface after such a treatment is larger than 30°. It is disclosed that the specimen is then immersed in a mixture of a xylene solution of trimethoxypropylsilane (TMPSi) and $TiO_2$ nanoparticles for coating to achieve a contact angle of larger than 150° (specifically in Table 2). It is to be noted that there is no description of forming a removable surface layer on the specimen surface after the treatment with the xylene or xylene-containing solution.

In US 2012/0142795 A1, it is disclosed that a thermoplastic resin is treated with a solvent over approximately 1 minute to approximately 5 hours, and then dried at room temperature for forming a hierarchical surface structure composed of a micro-scaled structure and a nano-scaled structure to produce a superhydrophobic surface.

In US 2012/0142795 A1, it is specifically disclosed that a polycarbonate is treated with acetone to form a layer having the hierarchical structure composed of a micro-scaled spherulitic structure formed on the polycarbonate surface and a nano-scaled fibrous structure formed on the spherulitic structure. A crystallinity on the polycarbonate surface depends on a treatment time with the solvent, and it is indicated that, in the case of using acetone, the crystallinity reaches a peak in a treatment time of approximately 30 minutes with almost no change after that (paragraph [0016] and FIG. 3).

Furthermore, it is disclosed that, on selection of the polymer and the solvent, the solubility parameters of them are close and that the crystallization and the hierarchal structure are generated on the polymer surface by vaporizing the solvent after immersing the polymer in the solvent. In the case of combination of the polycarbonate and acetone, a difference in Hildebrand's solubility parameter is 5.25 $MPa^{1/2}$. Also, in US 2012/0142795 A1, there is no description of forming a removable surface layer on the specimen surface after the treatment of the polycarbonate with acetone.

SUMMARY

In consideration of the above circumstances, it is an object of the present disclosure to provide a method that can manufacture a processed body having highly hydrophobic and water repellent surface with a simple procedure in a short time without using materials such as silicon compounds (for example, trimethoxypropylsilane (TMPSi)) and titanium oxide (for example, $TiO_2$ nanoparticles) that have been known in the conventional art to give water repellency; and a processed body provided with a highly hydrophobic and water-repellent surface.

The present disclosure may be configured as follows.

A method of manufacturing a processed body provided with a highly hydrophobic and water-repellent surface, the method comprising:
(a) a step of contacting a member made of a crystalline or semicrystalline polymer with a solvent in a solvent-contacting region; and
(b) a step of taking the member contacted with the solvent out of the solvent-contacting region and drying the member, wherein
a difference between Hildebrand's solubility parameters of the polymer and the solvent is less than 7.5 $MPa^{1/2}$,
a boiling point of the solvent is higher than a crystallization temperature (Tc) of the polymer,
a temperature of the solvent when the member is contacted with the solvent is Tc of the polymer±50° C. and equal to or lower than the boiling point of the solvent, and
a temperature of drying the member is lower than Tc of the polymer by at least 20° C.

The method according to [1], wherein the polymer is selected from polyethylene (PE), polypropylene (PP), polyamide (PA), polyacetal (POM), polyethylene terephthalate (PET), polybutylene terephthalate (PBT), polylactic acid (PLA), syndiotactic polystyrene (SPS), polytetrafluoroethylene (PTFE), polychlorotrifluoroethylene (PCTFE), polyvinyl fluoride (PVF), polyvinylidene fluoride (PVDF), or a mixture, a composite, a nanocomposite, or a blend of two or more of these polymers, and the polymer may be a homopolymer or a copolymer containing a monomer different from the monomer forming the polymer.

The method according to [1] or [2], wherein the solvent is selected from n-pentane, n-hexane, n-heptane, n-octane, n-nonane, n-decane, n-undecane, n-dodecane, diethyl ether, cyclohexane, xylene, decalin, ethyl acetate, butyl acetate, benzene, methyl ethyl ketone, acetone, pyridine, diethylamine, butyl isobutyrate, butyl n-butyrate, butyl chloride, isobutyl ether, isobutyl formate, isodecyl acrylate, diacetone alcohol, methyl ether, tetralin, acetonitrile, acrylic acid, benzyl alcohol, 1,4-butanediol, 2,3-butylene carbonate, butyrolactone, chloroacetonitrile, diethylene glycol, diethyl sulfone, ethylacetamide, ethylenediamine, formic acid, phenylhydrazine, tolylene diisocyanate, acetic acid, dimethyl sulfoxide (DMSO), nitrobenzene, phenol, o-chlorophenol, 1,1,1,3,3,3-hexafluoro-2-propanol, o-cresol, toluene, chlorobenzene, 1,2-dichlorobenzene, chloroform, 1,4-dioxane, tetrahydrofuran, N,N-dimethylformamide (DMF), or a mixture of two or more of these solvents or a mixture of these solvents and another solvent.

The method according to any one of [3], wherein the solvent is a liquid phase or a gas phase.

The method according to any one of [1] to [4], wherein a time of contacting the member with the solvent in the step (a) is at least 30 seconds.

The method according to any one of [1] to [5], wherein a temperature of the solvent in the solvent-contacting region is 90 to 160° C.

The method according to any one of [1] to [6], wherein the member is preheated before the step (a).

The method according to any one of [1] to [7], wherein the drying in the step (b) is divided into a plurality of steps, performed by using the same or different drying means at the same or different temperatures.

The method according to any one of [1] to [8], wherein one or more additives selected from the group consisting of a flame retardant, an antioxidant, an ultraviolet absorber, a stabilizer, a filler, an antistatic agent, a lubricant, a dispersant, a reinforcing material, a colorant, an electroconductive filler, and a thermoconductive filler are added to the polymer.

The method according to any one of [1] to [9], wherein the member has a shape of a planar film, sheet, or plate; a shape of a film, sheet, or plate having a bent part; or a three-dimensional shape.

The method according to any one of [1] to [10], wherein a skin layer formed on a surface of the member is removed.

A processed body obtained by the method according to any one of [1] to [11], the processed body comprising at least one highly hydrophobic and water-repellent surface.

A skin layer obtained by the method according to [11], the skin layer comprising a highly hydrophobic and water-repellent surface.

A processed body consisting of a crystalline or semicrystalline polymer substrate and a crystallite structure layer, wherein the crystallite structure layer comprises spherulites having an average particle diameter of 300 nm to 70 μm and nanostructures having an average particle diameter of 60 nm to 1500 nm that are present on a surface of the polymer substrate, and the average particle diameter of the nanostructures is smaller than the average particle diameter of the spherulites.

The processed body according to [14], wherein the nanostructures are present on a surface of the spherulites.

The processed body according to [14] or [15], wherein the polymer substrate is a thermoplastic resin.

The processed body according to any one of [14] to [16], wherein the polymer substrate is a semicrystalline plastic.

The processed body according to any one of [14] to [17], wherein the polymer substrate is polypropylene (PP).

The processed body according to any one of [14] to [18], wherein the composition of the polymer substrate and the composition of the crystallite structure layer are the same.

As described above, in manufacturing the processed body comprising a highly hydrophobic and water repellent surface with the method according to the present disclosure, the processed body comprising a highly hydrophobic and water-repellent surface can be manufactured in a short time without the need of providing a coating with a water-repellent material different from the material forming the processed body, such as a fluorine processing and a silane treatment, and without the need of using an expensive apparatus and complex process, such as etching using laser or plasma and adding a titanium oxide such as $TiO_2$ nanoparticles for producing a fine surface structure that gives water repellency, and with a simple and inexpensive method of a simple treatment with a solvent.

According to the present disclosure, the processed body obtained through the steps (a) and (b) has a skin layer formed on a surface of a crystalline substrate or semicrystalline substrate, for example a crystalline or semicrystalline polymer substrate, treated with the solvent. On a boundary between the skin layer and the processed body, spherulitic structures are formed on both surfaces of a processed body surface contacting with the skin layer and the skin layer contacting with the processed body surface, and the both spherulitic structures are highly hydrophobic and water repellent. This spherulitic structure is a crystallite structure layer of a hierarchal structure (double structure) in which nanocrystals or nanostructures (primary structure) having an average particle diameter of 60 nm to 1500 nm, preferably 150 nm to 1400 nm, are provided on a surface of spherulites (secondary structure) having an average particle diameter of 300 nm to 70 μm, preferably 20 μm to 70 μm. The size (average particle diameter) of the nanocrystals is not larger than the size (average particle diameter) of the spherulites. The average particle diameters of the spherulites and nanocrystals are average particle diameters determined from a scanning electron microscope (SEM) image.

This skin layer can be removed from the processed body immediately after the steps (a) and (b), and can also be easily removed after a certain period of time from manufacturing the processed body. Thus, to protect the water-repellent surface formed on the surface of the processed body, the skin layer can also be left to be attached to the processed body until just before the use of the processed body.

Meanwhile, the skin layer removed from the processed body, which has the highly hydrophobic and water-repellent surface similar to the processed body, can also be used for the same applications as those of the processed body or different applications from those of the processed body.

DETAILED DESCRIPTION

Figure 1:
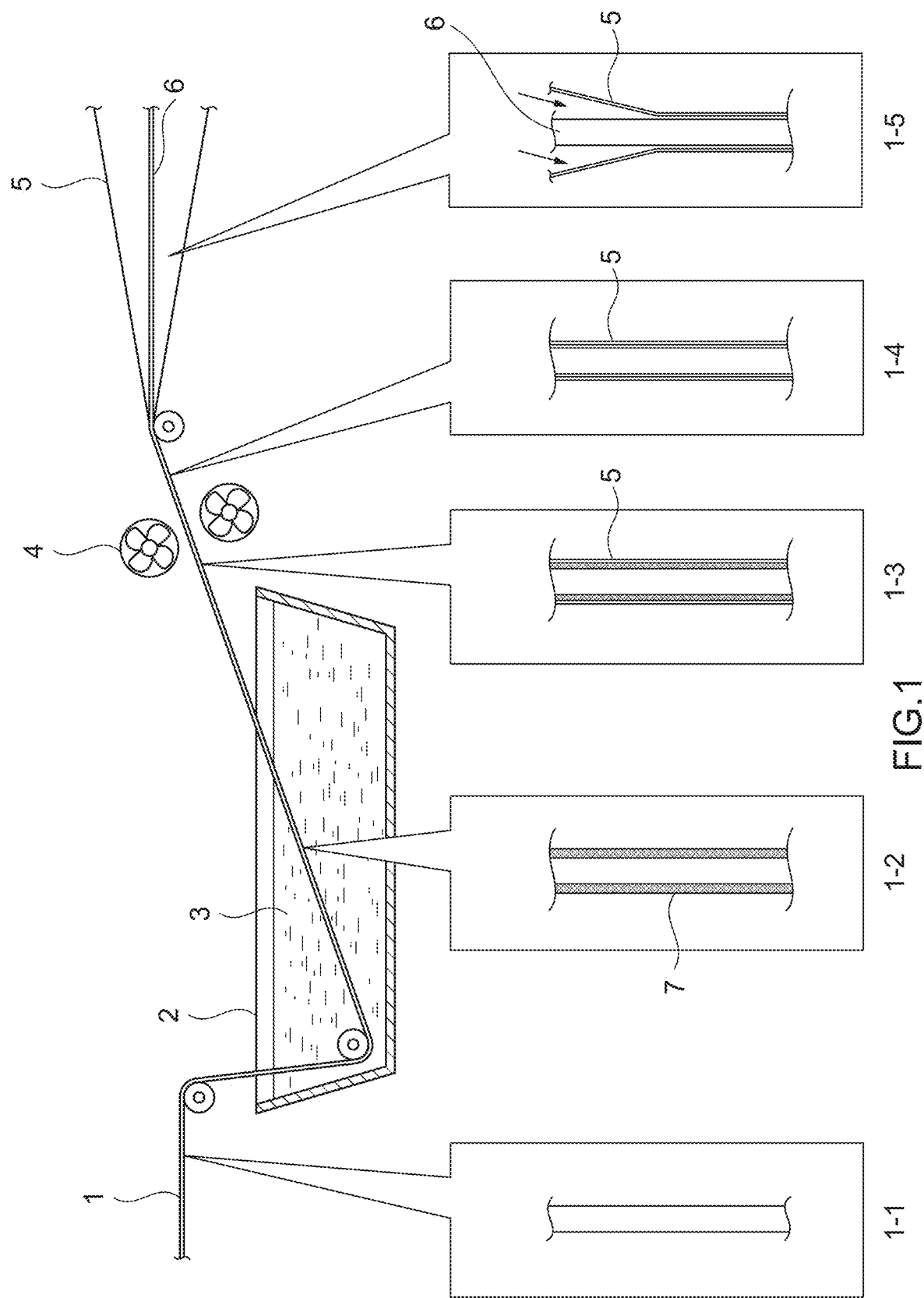
FIG. 1 is a view illustrating: one aspect of a method of manufacturing a processed body provided with a highly hydrophobic and water-repellent surface according to the present disclosure; and formation of the processed body and skin layer having a highly hydrophobic and water-repellent surface according to the present disclosure.

Hereinafter, a method of manufacturing a processed body provided with a highly hydrophobic and water-repellent surface according to an embodiment of the present disclosure will be described in detail.

A method of manufacturing a processed body provided with a highly hydrophobic and water-repellent surface comprises (a) a step of contacting a member made of a crystalline or semicrystalline polymer (polymer substrate) with a solvent in a solvent-contacting region, and (b) a step of taking the member contacted with the solvent out of the solvent-contacting region, and then drying the member. In the step (a), a difference between Hildebrand's solubility parameters of the polymer and the solvent is less than 7.5 $MPa^{1/2}$, and from the viewpoint of forming a surface having good water repellency, preferably less than 7.2 $MPa^{1/2}$, more preferably less than 5.25 MPa and further preferably less than 5 $MPa^{1/2}$. A boiling point of the solvent is higher than a crystallization temperature (Tc) of the polymer. A temperature of the solvent when the member is contacted with the solvent is Tc of the polymer±50° C. and equal to or lower than the boiling point of the solvent. In the polymer substrate, when a proportion of a polymer consisting only of carbon and hydrogen or consisting only of carbon, hydrogen, and oxygen is 80% or more, it is preferable that the temperature of the solvent when the member is contacted with the solvent be higher than Tc of the polymer but be equal to or lower than the boiling point of the solvent from the viewpoint of forming a highly hydrophobic and good water-repellent surface. In the step (b), a temperature of drying the member is lower than Tc of the polymer by at least 20° C.

[Polymer]

The member used in the present disclosure is made of the crystalline or semicrystalline polymer. As the polymer, polyethylene (PE), polypropylene (PP), polyamide (PA), polyacetal (PQM), polyethylene terephthalate (PET), polybutylene terephthalate (PBT), polylactic acid (PLA), syndiotactic polystyrene (SPS), polytetrafluoroethylene (PTFE), polychlorotrifluoroethylene (PCTFE), polyvinyl fluoride (PVF), and polyvinylidene fluoride (PVDF) can be used, for example. In addition, a mixture, a composite, a nanocomposite, or a blend of two or more of the polymers can also be used. From the viewpoint of processability, it is preferable that the polymer be a thermoplastic resin.

The polymer may be a homopolymer or a copolymer. As a homopolymer or copolymer of polypropylene, TIPPLEN (R) H681F, H649FH, H145F, H880, K793, K597, K199, K395A, K948, 8660, 8359, R959A and the like can be used, for example. Polyethylene may be high-density polyethylene (HDPE) or low-density polyethylene (LDPE). The high-density polyethylene may also be referred to as moderate- or low-pressure-processed polyethylene based on the manufacturing method, and typically referred to polyethylene having a specific gravity of approximately 0.94 or more. The low-density polyethylene may also be referred to as high-pressure-processed polyethylene based on the manufacturing method, and typically referred to polyethylene having a specific gravity of approximately 0.91 to 0.93.

As the polymer forming the member in the present disclosure, it is preferable to use polypropylene, polyethylene, polylactic acid, and polyvinylidene fluoride (PVDF), particularly polypropylene, because the finally obtained water repellency becomes high.

To the polymer according to the present disclosure, additives commonly used in the plastic field, for example, a flame retardant, an antioxidant, an ultraviolet absorber, a stabilizer, a filler, an antistatic agent, a lubricant, a dispersant, a reinforcing material, a colorant, and a thermoconductive filler and/or an electroconductive filler may be added. The above additives are merely examples, and other additives may be added to the polymer instead of these additives or in addition to these additives.

[Solvent]

The solvent to treat the member in the step (a) according to the present disclosure is not particularly limited as long as it satisfies two requirements: a difference between a solubility parameter (Hildebrand's solubility parameter, hereinafter referred to as SP value) of the solvent and a SP value of the polymer forming the member is less than 7.5 $MPa^{1/2}$, preferably less than 7.2 $MPa^{1/2}$, more preferably less than 5.25 $MPa^{1/2}$, and further preferably less than 5 $MPa^{1/2}$; and the boiling point of the solvent is higher than a crystallization temperature (Tc) of the polymer. As the solvent, a solvent selected from n-pentane, n-hexane, n-heptane, n-octane, n-nonane, n-decane, n-undecane, n-dodecane, diethyl ether, cyclohexane, xylene, decalin, ethyl acetate, butyl acetate, benzene, methyl ethyl ketone, acetone, pyridine, diethylamine, butyl isobutyrate, butyl n-butyrate, butyl chloride, isobutyl ether, isobutyl formate, isodecyl acrylate, diacetone alcohol, methyl ether, tetralin, acetonitrile, acrylic acid, benzyl alcohol, 1,4-butanediol, 2,3-butylene carbonate, butyrolactone, chloroacetonitrile, diethylene glycol, diethyl sulfone, ethylacetamide, ethylenediamine, formic acid, phenylhydrazine, tolylene diisocyanate, acetic acid, dimethyl sulfoxide (DMSO), nitrobenzene, phenol, o-chlorophenol, 1,1,1,3,3,3-hexafluoro-2-propanol, o-cresol, toluene, chlorobenzene, 1,2-dichlorobenzene, chloroform, 1,4-dioxane, tetrahydrofuran, N,N-dimethylformamide (DMF), or a mixture of two or more of these solvents or a mixture of these solvents and another solvent may be used, for example. Among them, it is preferable to use xylene, decalin, butyl acetate, and DMSO from the viewpoint of forming a good skin layer. Even when the mixture of two or more of the solvents or the mixture of the solvents and another solvent is used, it should be noted that the difference between the SP value of the solvent mixture and the SP value of the polymer forming the member should be less than 7.5 $MPa^{1/2}$, preferably less than 7.2 $MPa^{1/2}$, more preferably less than 5.25 $MPa^{1/2}$, and further preferably less than 5 $MPa^{1/2}$, in accordance with the "mixture rule".

The SP value can be determined based on information of an existing database (see for example, http://polymerdatabase.com/polymer %20physics/delta %20Table.html), and can be estimated with UV measurement of a solution, a degree of swelling, a cloud point, theoretical calculation, and the like (unit: $MPa^{1/2}$).

The SP value is for estimating interaction between a plurality of substances with a value, and is an indicator of solubility of a substance such as, for example, many polymers.

From the viewpoint of further decreasing the difference in the SP value, when polypropylene is used as the polymer, a preferable solvent is, for example, xylene, decalin, and butyl acetate. When polyethylene is used as the polymer, a preferable solvent is, for example, decalin. When PVDF is used as the polymer, a preferable solvent is, for example, DMSO.

The temperature of the solvent when the solvent and the member are contacted with each other is Tc of the polymer±50° C. and equal to or lower than the boiling point of the solvent. In particular, with a resin having a proportion of a polymer made of only carbon and hydrogen (or only carbon, hydrogen, and oxygen) in the polymer component in the resin of 80% or more, it is preferable that the temperature of the solvent be higher than Tc of the polymer and be equal to or lower than the boiling point of the solvent. A phase of the solvent when the solvent and the member are contacted with each other may be either of a liquid phase or a gas phase. It is preferable that the temperature of the solvent when the solvent is contacted with the member be 90 to 160° C., and it is more preferable that it be 110 to 150° C. from the viewpoints of removability of the skin layer and formation of a highly hydrophobic and highly water-repellent surface.

[Step (a)]

In the step (a), a time of contacting the member and the solvent with each other in the solvent-contacting region is not particularly limited, and it is preferable that it be at least 30 seconds from the viewpoints of obtaining a highly hydrophobic and good water-repellent surface and forming a continuous and removable skin layer. The contacting time of the member and the solvent, which depends on a type of the used polymer, a type of the used solvent, and the temperature when the member and the solvent are contacted with each other, is typically approximately 30 seconds to 10 minutes with considering efficiency of the process and the layer having high hydrophobicity and good water repellency.

From the viewpoint of the efficiency of the process, it is preferable that the member be preheated prior to the step (a). A temperature of the preheating is not particularly limited, and it is preferable that it be equal to or lower than the temperature when the member and the solvent are contacted with each other.

[Step (b)]

Subsequently to the step (a), the member after the treatment is taken out of the solvent-contacting region where the member and the solvent are contacted with each other, and is dried. A temperature of drying the member after the treatment is lower than Tc of the polymer forming the member by at least 20° C., and preferably lower than Tc of the polymer forming the member by at least 30° C. The drying of the member may also be performed at ambient temperature or room temperature. From the viewpoint of controlling the formation of the skin layer, it is preferable that the drying in the step (b) be divided into a plurality of steps, performed by using the same or different drying means at the same or different temperatures. The number of the steps, drying means to be used, and the drying temperature are not particularly limited, and it is preferable that the temperature of one or more of the drying steps prior to the final drying step be a temperature not higher than the temperature of the final drying step.

In FIG. 1, illustrated is a series of aspects in which: a sheet-shaped or web-shaped member 1 is contacted with a solvent 3 in a solvent vessel 2 (solvent-contacting region); the member 1 is taken out of the solvent vessel 2 and then subjected to a drying means 4; and then a skin layer 5 formed on a surface of the member 1 is removed to obtain a processed body 6 provided with a superhydrophobic and water-repellent surface.

In FIG. 1, further illustrated corresponding to the above steps with each schematic view are: a cross section 1-1 of the member 1 before contacted with the solvent; a cross section 1-2 of the member 1 in which a swelled gel layer 7 is formed on the surface by contacting with solvent 3 in the solvent vessel 2 (solvent-contacting region); cross sections 1-3 and 1-4 of the member 1 taken out of the solvent vessel 2 and having the skin layer 5 formed thereon; and a cross section 1-5 when the skin layer 5 after drying is removed to obtain the processed body 6.

The method according to the present disclosure can also be performed in a batchwise embodiment instead of the continuous embodiment as illustrated in FIG. 1. Any method may be employed, and it depends on, for example, a manufacturing facility, a shape of the member, and the like. Any shape of the member may also be employed, and it is not particularly limited as long as it can be treated with the method according to the present disclosure.

Although an embodiment of the planar member is illustrated in FIG. 1, the shape of the member may be, other than a planar sheet, film, web, board (also referred to as a plank or a plate having a thickness of approximately 1 mm or more) and the like, a three-dimensional shape (a bottle of shampoo and the like are expected, for example). The member may be of a flexible material that can be wound. According to JIS (Japanese Industrial Standards), a film is referred to a membrane-shaped plastic having a thickness of less than 250 μm, and a sheet is referred to a plate-shaped plastic having a thickness of 250 μm or more.

[Processed Body and Skin Layer Having Water-Repellent Surface]

With the method according to the present disclosure, a polymer processed body having a highly hydrophobic and water-repellent surface can be manufactured simply in a short time. It is not necessary to add a water-repellent material different from the substrate or a material for forming a water-repellent structure such as, fo example, nanoparticles of titanium oxide as in the method of the conventional art. The polymer processed body having a highly hydrophobic and water-repellent surface can be manufactured by drying the member in the step (b), and on the member surface that has been contacted with the solvent in the step (a), a layer (skin layer) removable from the member is formed. On a boundary between the skin layer and the processed body, both surfaces of the processed body surface contacted with the skin layer and the skin layer surface contacted with the processed body surface are surfaces having high hydrophobicity and water repellency. The "skin layer" in the present disclosure is referred to a membrane-shaped processed body having a two-dimensional or three-dimensional shape of film, sheet, or web.

The skin layer may be left not to be removed until just before use of the processed body to, for example, protect the highly hydrophobic and water-repellent surface produced on the processed body surface. Having the highly hydrophobic and water-repellent surface similar to the processed body, the skin layer removed from the processed body may be used as a highly hydrophobic and water-repellent sheet and the like. A thickness of the skin layer, which depends on types of the polymer and solvent to be used, the temperature and time when the polymer member is contacted with the solvent, the time of drying the polymer member, and the like, is typically approximately 10 to 200 µm, and it is more preferable that it be approximately 10 to 100 µm for improvement in light transparency to be used as a translucent member.

The processed body manufactured by the method according to the present disclosure comprises the crystalline or semicrystalline polymer substrate and the crystallite structure layer, and the crystallite structure layer comprises spherulites having an average particle diameter of 300 nm to 70 µm, preferably 20 µm to 70 µm, and nanostructures having an average particle diameter of 60 nm to 1500 nm, preferably 150 nm to 1400 nm, that are present on a surface of the polymer substrate. In this case, the average particle diameter of the nanostructures is not larger than the average particle diameter of the spherulites. That is, the average particle diameter of the nanostructures is smaller than the average particle diameter of the spherulites. Preferably, the nanostructures are present on the surface of the spherulites, and the average particle diameter of the nanostructures present on the surface of the spherulites is smaller than the average particle diameter of the spherulites.

Therefore, according to the present disclosure, the composition of the polymer substrate of the processed body and the composition of the crystallite structure layer are the same.

Figure 2:
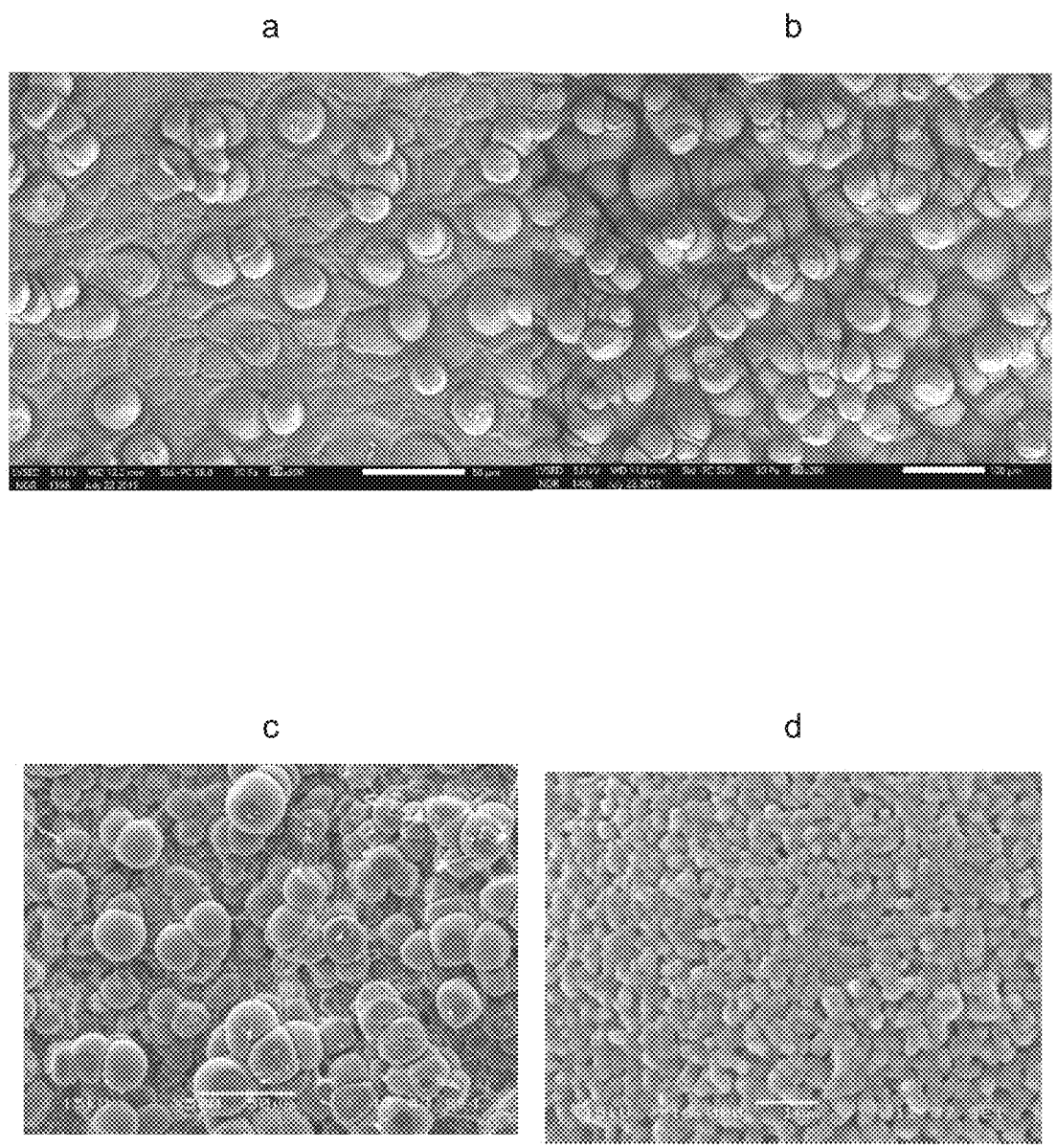
FIG. 2 is a view showing electron-microscopic photographs of a highly hydrophobic and water-repellent surface (hierarchal structure) of a processed body and skin layer produced by the present disclosure.

FIG. 2 shows electron-microscopic photographs of the hierarchal structure of the processed body surface (a photograph a showing the micro-structure and a photograph b showing the nanostructure) and the skin layer surface (photographs c and d showing the micro-structure) that are obtained by the method according to the present disclosure. From these photographs, it is obvious that the hierarchal crystallite structure composed of the spherulitic structure as the secondary structure (a, c, and d) and the nano-crystallite structure as the primary structure (b) are formed on the surfaces of the processed body and skin layer. The particle diameters of these spherulites and crystals are values obtained by: using an SEM to focus on the outermost surface of these structure; specifying at least 20 structures on the outermost surface that have measurable diameters; and measuring the diameters of these structures with ImageJ (image processing software). The above average particle diameter is an averaged value of values of the diameters of the at least 20 structures obtained with ImageJ. The average particle diameters of the spherulites and nanostructures obtained by this method and shown in the photographs a to d are as follows:

a: 21.1 µm
b: 48.9 µm
c: 25.6 µm
d: 213 nm

Hereinafter, the manufacture of the processed body provided with the highly hydrophobic and water-repellent surface according to the present disclosure will be described based on Examples, but the present disclosure is not limited to the aspects of these Examples.

Example 1

A sheet composed of a polypropylene homopolymer (TIPPLEN H681F, crystallization temperature Tc: 109° C., melting temperature Tm: 167° C., SP value: 16.2 MPa$^{1/2}$) was contacted with decalin (boiling point: 187° C., SP value: 18.00 MPa$^{1/2}$) at 150° C. over a predetermined time in a solvent-contacting region (step (a)). Then, the polypropylene sheet was taken out of the solvent-contacting region, and was dried at room temperature (step (b)).

Examples 2 to 9

The same procedure was performed as in Example 1 using polymers and solvents shown in Table 1 at a treatment temperature and drying temperature as shown in Table 1.

Comparative Example 1

A polypropylene homopolymer was used as the polymer, and dimethyl sulfoxide (DMSO) was used as the solvent. A difference between SP values of the polymer and the solvent was more than 8 MPa$^{1/2}$.

Comparative Example 2

A polypropylene homopolymer was used as the polymer, and acetone was used as the solvent. The temperature of the solvent in the step (a) was 56° C., which was lower than the crystallization temperature of polypropylene of 109° C.

Comparative Example 3

A polypropylene homopolymer was used as the polymer, and decalin was used as the solvent. The temperature of the solvent in the step (a) was 130° C., and the drying temperature in the step (b) was 100° C.

[Results]

Summarized in the following Table 1 are: the polymer used in these Examples and Comparative Examples; the crystallization temperature Tc, melting temperature Tm, and SP value (Hildebrand's solubility parameter) of the polymer; the type, boiling point, and SP value of the solvent; the process condition; and the constitution of the crystallite structure layer and results of hydrophobicity and water repellency of the substrate surface after the treatment or the obtained processed body. The SP values of the solvents and polymers shown in Table 1 are literature values, and each of the crystallization temperature Tc and the melting temperature Tm is a value specified by differential scanning calorimetry (DSC).

TABLE 1

| | Solvent | | Polymer | | | | |
|---|---|---|---|---|---|---|---|
| | | Boiling point | Hildebrand's solubility [MPa^½] | | Tc | Tm | Hildebrand's solubility [MPa^½] | Difference in SP value |
| Example 1 | Decalin | 187 | 18.00 | PP homopolymer H681F | 109 | 167 | 16.2 | <5 |
| Example 2 | Decalin | 187 | 18.00 | PP copolymer K793 | 111 | 163 | 16.2 | <5 |
| Example 3 | xylene | 137-143 | 18.00 | PP copolymer K793 | 111 | 163 | 16.2 | <5 |
| Example 4 | xylene | 137-143 | 18.00 | PP copolymer K793 | 111 | 163 | 16.2 | <5 |
| Example 5 | n-butyl acetate | 126 | 17.31 | PP homopolymer H681F | 109 | 167 | 16.2 | <5 |
| Example 6 | Decalin | 187 | 18.00 | HDPE | 111 | 131 | 16.7 | <5 |
| Example 7 | Decalin | 167 | 18.00 | PP homopolymer H681F | 109 | 167 | 16.2 | <5 |
| Example 8 | DMSO | 189 | 26.40 | PVDF | 140 | 175 | 23.7 | <5 |
| Example 9 | DMSO | 189 | 26.40 | PVDF | 140 | 175 | 23.7 | <5 |
| Comparative Example 1 | DMSO | 189 | 26.4 | PP homopolymer H681F | 109 | 167 | 16.2 | >5 |
| Comparative Example 2 | Acetone | 56 | 19.99 | PP homopolymer H681F | 109 | 167 | 16.2 | <5 |
| Comparative Example 3 | Decalin | 187 | 18.00 | PP homopolymer H681F | 109 | 167 | 16.2 | <5 |

| | Temperature of solvent step (a) | Drying temperature in step (b) | Layer of crystalline structure on substrate surface | | Results | |
|---|---|---|---|---|---|---|
| | | | Spherulite (μm) | Crystal (nm) | Evaluation | Advance angle/ Retreat angle (CAH) |
| Example 1 | 150 | Ambient temperature | 25 | 200 | Excellent | 155/153 |
| Example 2 | 150 | Ambient temperature | 56 | 1250 | Excellent | 155/152 |
| Example 3 | 143 | Ambient temperature | 66 | 1400 | Excellent | 159/155 |
| Example 4 | 125 | Ambient temperature | 24 | 179 | Excellent | 158/155 |
| Example 5 | 126 | Ambient temperature | 0.31 | 120 | Fair | 152/145 |
| Example 6 | 130 | Lower than ambient temperature | 9 | 950 | Good | 151/149 |
| Example 7 | 150 | 80° C. | 42 | 291 | Excellent | 155/152 |
| Example 8 | 120 | Ambient temperature | 1.6 | 75 | Fair | 148/142 |
| Example 9 | 90 | Ambient temperature | 0.9 | 69 | Fair | 149/144 |
| Comparative Example 1 | 130 | Ambient temperature | Spherulite was not formed on substrate surface | | Poor | 92/82 |
| Comparative Example 2 | 56 | Ambient temperature | | | Poor | 97/94 |
| Comparative Example 3 | 130 | 100° C. | | | Poor | 89/82 |

Evaluation of "hydrophobicity and water repellency" in the column of "Results" in Table 1 is as follows.

Excellent: An excellent hydrophobic and water-repellent surface (an advancing contact angle of 1 more as the static wettability and a CAH of 5° or less as the dynamic wettability) was obtained.

Good: A good hydrophobic and water—repellent surface (an advancing contact angle of 150° or more as the static wettability and a CAH of 5° or less as the dynamic wettability) was obtained.

Fair: A hydrophobic and water-repellent surface (an advancing contact angle of 140° or more and less than 150° as the static wettability or a CAH of more than 5° and 10° or less as the dynamic wettability) was obtained.

Poor: A poor hydrophobic and water-repellent surface (an advancing contact angle of less than 140° as the static wettability and/or a CAH of 10° or more as the dynamic wettability).

The CAH, which represents a contact angle hysteresis, is a value obtained by subtracting a value of a receding contact angle from a value of an advancing contact angle. The advancing contact angle is a contact angle when a droplet spreads (expands), and also described as a (dynamic) advancing contact angle θα. The receding contact angle is a contact angle when a wetting contracts, and also described as a (dynamic) receding contact angle θγ. The high value of advancing contact angle is an indicator of high hydrophobicity (low wettability). A small value of the CAH is an indicator of good water repellency. Measurements of the advancing contact angle and the receding contact angle were performed as follows by using the droplet method in which an angle formed between a solid surface and a droplet when the droplet is contacted with the solid surface and when a part of the droplet is removed is specified as θ.

On a treated surface of a sample (processed body), 20 μL of deionized water is placed, and a contact angle θ is measured (advancing contact angle). The contact angle θ is a value obtained by recording a shape of the droplet placed on the sample surface with a high-resolution CCD camera to measure the angle using the ImageJ software. Then, a portion of the droplet (10 μL) is removed by a syringe and the shape of the droplet was recorded again and the modified contact angle (receding contact angle) was determined by ImageJ software. The measurement is performed at room temperature (25° C.). This measurement is performed at least five times to determine the average value.

As shown in Table 1, in Examples 1 to 9 according to the present disclosure, the processed body having the removable skin layer and having a sufficiently hydrophobic and water-repellent surface was obtained. In Examples 1 to 5 and 7, the skin layer was more stable than that of other Examples.

Meanwhile, in Comparative Example 1, which had a difference between SP values of the polymer and solvent of more than 7.5 $MPa^{1/2}$, the surface having good hydrophobicity and water repellency was not obtained even with satisfying the other requirements of the present disclosure. In Comparative Example 2, the difference between the temperature of the solvent and the crystallization temperature of the polymer in the step (a) was 50° C. In this Comparative Example, the removable skin layer was not formed and the sufficiently hydrophobic and water-repellent surface was not obtained even with satisfying the requirements of the present disclosure other than the temperature of the solvent. In Comparative Example 3, the drying temperature of the member in the step (b) was 100° C., which was lower than the crystallization temperature of polypropylene of 109° C. by 9° C., and also in this case, the removable skin layer was not formed and the sufficiently hydrophobic and water-repellent surface was not obtained.

The processed body and skin layer having the hydrophobic and water-repellent surface obtained by the novel manufacturing method according to the present disclosure can be used, for example in the medical and nursing fields, as a water-repellent sheet for medical or nursing sheets and for a surgical gown, or a hydrophobic and water-repellent sheet for an antenna or a hydrophobic and water-repellent cover to prevent radio attenuation due to rainfall and snowfall.

In addition, utilizing the hydrophobicity and water repellency on the surface or utilizing the characteristics in which dirt contained in a waterdrop does not adhere to the hydrophobic and water-repellent surface or in which dirt adhering to the surface flows down together with the waterdrop, the antifouling effect or self-cleaning effect is exhibited by use for, for example, exterior walls of buildings, bathtubs of baths and toilets, toilet bowls, floors, walls, ceilings, or counters or sinks of kitchens, furniture, and appliances.

By using the processed body according to the present disclosure for surface materials of vehicles, aircraft, and watercraft, the fluid resistance is reduced to enable to improve the fuel efficiency and reduce $CO_2$ emission.

In the processed body and skin layer according to the present disclosure, the fine structure or fine concave-convex structure that the water-repellent surface has both high reflection characteristics and scattering characteristics. Therefore, by using the processed body and skin layer for, for example, optical parts and lighting apparatuses, the functions such as water-repellency antifouling, and reflection and scattering can also be exhibited.

What is claimed is:

1. A processed body comprising:
a crystalline or semicrystalline polymer substrate; and
a crystallite structure layer, wherein
the crystallite structure layer comprises spherulites having an average particle diameter of 56 μm to 70 μm and nanostructures having an average particle diameter of 60 nm to 1500 nm that are present on a surface of the polymer substrate, and the average particle diameter of the nanostructures is smaller than the average particle diameter of the spherulites.

2. The processed body according to claim 1, wherein the nanostructures are present on a surface of the spherulites.

3. The processed body according to claim 1, wherein the polymer substrate is a thermoplastic resin.

4. The processed body according to claim 3, wherein the polymer substrate is a semicrystalline plastic.

5. The processed body according to claim 4, wherein the polymer substrate is polypropylene (PP).

6. The processed body according to claim 1, wherein a composition of the polymer substrate and a composition of the crystallite structure layer are the same.

7. The processed body according to claim 1, further comprising a skin layer configured to be removed, wherein the skin layer has a hydrophobic surface similar to the processed body.

* * * * *